United States Patent [19]

Tanaka et al.

[11] Patent Number: 4,525,335
[45] Date of Patent: Jun. 25, 1985

[54] METHOD OF MANUFACTURING CRYSTALLINE SILICON NITRIDE AND METHOD OF SEPARATION THEREOF

[75] Inventors: Minoru Tanaka, Kobe; Tadashi Kawabe, Ako, both of Japan

[73] Assignee: Tateho Kagaku Kogyo Kabushiki Kaisha, Ako, Japan

[21] Appl. No.: 476,200

[22] Filed: Mar. 17, 1983

[30] Foreign Application Priority Data

Apr. 1, 1982 [JP] Japan .................................. 57-55196

[51] Int. Cl.³ .................... C01B 21/068; B03B 5/30
[52] U.S. Cl. ............................... 423/344; 209/9; 209/172; 422/188; 422/194; 423/406
[58] Field of Search ............... 423/344, 406; 209/172, 209/9; 422/194, 188

[56] References Cited

U.S. PATENT DOCUMENTS

| | | | |
|---|---|---|---|
| 3,084,998 | 4/1963 | Dess | 423/344 |
| 3,244,480 | 4/1966 | Johnson et al. | 423/344 |
| 3,855,395 | 12/1974 | Cutler | 423/344 |
| 4,206,190 | 6/1980 | Harvey et al. | 423/344 |
| 4,235,857 | 11/1980 | Mangels | 423/344 |
| 4,256,571 | 3/1981 | Somasundaran et al. | 209/5 |

FOREIGN PATENT DOCUMENTS

| | | | |
|---|---|---|---|
| 17499 | 1/1982 | Japan | 423/344 |
| 196711 | 12/1982 | Japan | 423/344 |
| 1273145 | 5/1972 | United Kingdom | 423/344 |
| 1410841 | 10/1975 | United Kingdom | 423/344 |
| 1414143 | 11/1975 | United Kingdom | 423/344 |

Primary Examiner—G. L. Kaplan
Attorney, Agent, or Firm—Marshall, O'Toole, Gerstein, Murray & Bicknell

[57] ABSTRACT

A method of manufacturing silicon nitride whiskers in which a carbon and silicon containing material having a thin configuration and sufficient porosity to permit both the passage of a gas therethrough and to provide spaces for growing whiskers therein is charged on a gas-permeable tray, and heated in a furnace of non-oxidizing atmosphere. The tray is moved intermittently through a series of temperature zones, increasing stage-by-stage from about 400° C. to 1,300° C., while a non-oxidizing gas is circulated through the porous material to remove any impurities. Thereafter, the heated tray is intermittently moved through a series of increasing temperature stages from about 1,350° C. to 1,450° C. in the presence of a flow of nitrogen gas to effect whisker growth. The heat-treated silicon nitride-containing material is dispersed in a two-phase mixture of a hydrophobic organic liquid and water. The desired silicon nitride whiskers can be isolated from the aqueous phase.

10 Claims, 1 Drawing Figure

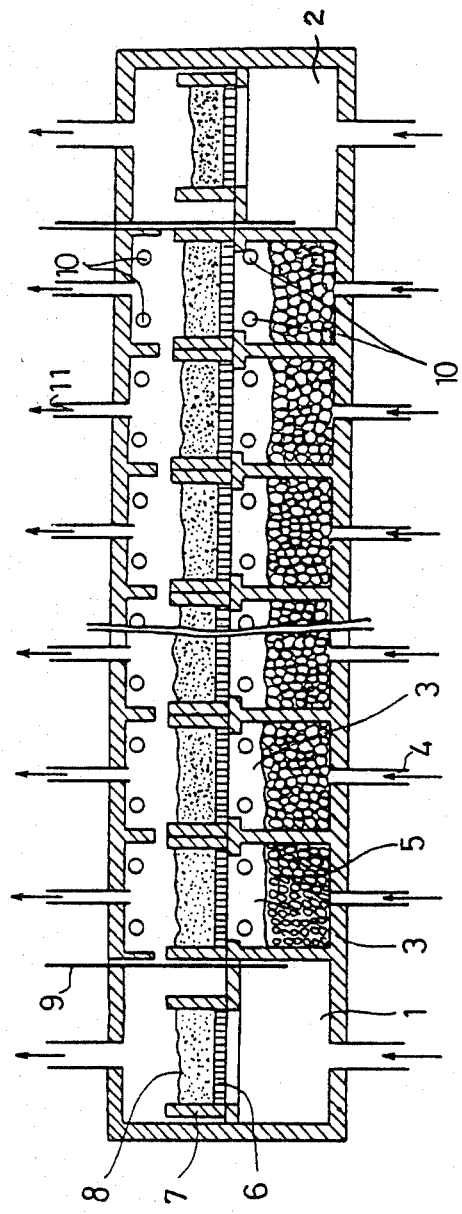

METHOD OF MANUFACTURING CRYSTALLINE SILICON NITRIDE AND METHOD OF SEPARATION THEREOF

BACKGROUND OF THE INVENTION

The present era has been called the "age of the material's revolution", wherein non-ferrous objects have been increasingly utilized in lieu of conventional iron and steel materials. In this context, the use of ceramic materials has become increasingly prevalent, with the result that ceramics now constitutes a "third material" which ranks in usage next to metals and plastics.

Historically, ceramics have been widely used because of their heat resistance, corrosion resistance, and anti-abrasion properties. Recently, new ceramic materials have been developed which take full advantage of these characteristics. Silicon nitride and silicon carbide, in particular, are the rising stars of these new ceramics and are the object of fierce competition in research and development.

Silicon nitride, with its very high thermal impulse resistance, excellent corrosion resistance, insulating properties as well as its inherent anti-abrasion properties is widely studied for applications in the field of aerospace, electronics, iron and steel, and ocean development. Because of its high temperature durability the material can also be used in ceramic engines.

Although these materials have attracted a great deal of attention, silicon nitride ceramics are thus far industrially available only in the form of powder or lump.

When in the form of a whisker or "whiskery crystal"—a single unit crystal—silicon nitride exhibits much higher mechanical strength than lump crystals of the same material. Thus whisker crystals of silicon nitride are receiving attention as reinforcing additives for obtaining composite materials of high mechanical strength.

DESCRIPTION OF THE PRIOR ART

One of the known methods of manufacturing silicon nitride whiskers is a gas phase method in which a crushed or pelletized silicon-containing material is heated in a furnace to produce silicon-containing vapor, and the vapor is reacted with nitrogen gas to form growing whiskers.

One of the defects of this method is that it is self-quenching. That is to say, if the heated powder or pellet of the material is brought into direct contact with nitrogen gas, silicon nitride produced between the powder grains or on the surface of the pellet prevents evaporation of silicon vapor from the interior of the grains or pellets.

One solution to this problem is shown in Japanese Patent Publication No. SHO. 41-17967 which proposes to infuse a carrier gas into the void spaces of the heated material to take out silicon-containing vapor and make it react with nitrogen gas in a space separated from the heated silicon-containing material. Another approach is illustrated in Japanese Patent Publication No. SHO. 49-27755, wherein a gaseous mixture of nitrogen and chlorine or hydrogen is passed through the silicon-containing material which causes the silicon vapor to be removed from the heated material, but delays or inhibits the reaction between the silicon component and nitrogen so that the silicon nitride does not cover the reactive material.

A common defect in both of these methods is that whiskers grow on the ceiling and side walls of the furnace. In addition, when whiskers are formed in a separate location, as in these cases, the conversion efficiency of the silicon component in the material into silicon nitride whiskers is very low; as low as 0.2 to 11.3% as shown in Japanese Patent Publication No. SHO. 50-4480.

Other prior art of particular interest to the present invention, includes U.S. Pat. No. 3,855,395 and Japanese Provisional Patent Publication No. SHO. 52-799. In the former patent, a mixture of rice husks containing about 3 wt % iron content is formed into a slurry by the addition of water, and, after drying, calcinated at 1,200° C. in a refractory crucible while being shut off from air. The calcinated mass is then pelletized by use of an organic binder and heated at a temperature of 1,300° C. to 1,400° C. under the circulation of $N_2$ gas.

In the latter laid-open Japanese patent specification, carbonized rice husks are heated in nitrogen atmosphere at a temperature of 1,300° C. to 1,600° C. (preferably after the material is powdered or adjusted in size by pelletizing). Both of these methods, however, provide only low purity and low yield of product, and are not favorable as an industrial manufacturing method to obtain silicon nitride whiskers.

BRIEF SUMMARY OF THE INVENTION

It is one of the objects of this invention to provide a simple method of manufacturing silicon nitride in the so-called whisker or whiskery crystal form and in higher yields.

Another object of the invention is to provide a method of separately collecting silicon nitride whiskers grown in the void spaces in the internal and external surfaces of the reactant material, without breaking or fracturing the whisker crystal configuration.

According to one aspect of the invention, to attain these objects, a silicon and carbon-containing material having a thin cross-section and sufficient void spaces (porosity) for growing whiskers therein is charged onto a tray, arranged on the tray to allow circulation of gas through said material, and placed in a furnace having a non-oxidizing atmosphere. The tray is moved intermittently through a series of increasing temperature zones from about 400° C. to 1,300° C., while a non-oxidizing gas such as argon or nitrogen is circulated through said void spaces of the material to remove any impurities. Thereafter, the heated tray is intermittently moved through a series of increased temperature stages from 1,350° C. to 1,450° C. In the reactant temperature zone (>1,350° C.), the gas circulated through the heated porous material should be nitrogen. The nitrogen gas reacts with the heated, porous silicon-containing material to form silicon nitride. The treated silicon-nitride material is dispersed in a mixture of hydrophobic organic liquid and water and left at rest. The desired silicon nitride whiskers can be readily isolated from the water phase.

BRIEF DESCRIPTION OF THE DRAWING

The drawing shows a cross-section of the furnace used in several of the Examples which illustrate various embodiments of the invention. The use of this type of furnace is only an example and is not to be understood to extend to all embodiments of the present invention.

DETAILED DESCRIPTION OF THE INVENTION

The present invention comprises basically two processes. In the first process, a silicon and carbon-containing material having a thin configuration with sufficient porosity to both permit the passage of a gas therethrough and to provide void spaces for growing whiskers therein is charged on a gas-permeable support, such as a perforated tray, under conditions to allow circulation of gas. The tray is heated in a furnace of non-oxidizing atmosphere, and is periodically moved through a series of temperature zones, increasing stage-by-stage from about 400° C. to 1,450° C. A sparging gas such as argon, nitrogen, or other non-oxidizing gas is circulated through said void spaces of the material, to remove the impurity components by evaporation and blowing off. Gaseous nitrogen can be used throughout the furnace, serving to sparge the system of impurities at temperatures below 1,300° C., and also functioning as a reactant at higher temperatures. Should argon or some other non-oxidizing gas be employed at lower temperatures, it must be replaced with nitrogen in zones of the furnace above 1,300° C.

At temperatures above 1,300° C. the desired silicon nitride crystals begin to be formed. The heating process is continued and the tray is intermittently moved through temperature zones ranging from 1,350° C. to about 1,450° C. to grow silicon nitride whiskers on the internal and external surfaces of the reactant material. A maximum temperature of less than about 1,425° C. is undesirable because of lessened conversion efficiency, while temperatures in excess of 1,450° C. are not economical. Upon leaving the maximum temperature zone, the material is allowed to cool.

Thereafter, in a second process, the reactant material, having silicon nitride whiskers on the internal and external surfaces thereof, is dispersed in a mixture of hydrophobic organic liquid and water and left at rest. The desired silicon nitride whiskers can be isolated from the water phase.

A suitable natural material which can be used as a silicon/carbon-containing raw material having a thin configuration with sufficient porosity for growing whiskers therein, is rice husks. Rice husks are an essentially commercially-useless by-product in rice growing agriculture, produced in large quantities. Rice husks contain 13 to 22 wt % $SiO_2$, 0.02 to 0.05 wt % $MgO$, 0.10 to 0.15 wt % $CaO$, 0.3 to 0.4 wt % $K_2O$, and 0.05 to 0.10 wt % $P_2O_5$, in addition to organic substances. When calcinated under closed, air-free conditions, the rice husks retain a ratio of carbon to silicon content from 7:3 to 5:5, with 60% of their weight scattered. The residual carbon content serves to help keep the shape of the rice husks during heating and facilitates the growth of whiskers in the voids in the internal and external surfaces of the calcinated material. $K_2O$ and $P_2O_5$ are blown off during the calcinating and carbonizing process and $MgO$ and $CaO$ can be removed by after-treatment.

Silicon, the major component of silicon nitride, is also available in the form of silicic anhydride at low cost. Typical sources of low-cost silicic anhydride include both silica sand and waste powder resulting from plate glass manufacture. For example, silica sand ("Shirasu") is widely distributed in Japan as a result of volcanic eruptions. The estimated amount of deposit in the southern Kyushu district, alone, is ninety billion (90,000,000,000) tons.

The chemical composition of Shirasu is shown in Table 1.

TABLE 1

| Place of Production Component | Taniyama Shirasu | | | Furue Shirasu | | |
|---|---|---|---|---|---|---|
| | Standard | Light | Heavy | Standard | Light | Heavy |
| $SiO_2$ | 70.2 | 72.6 | 65.4 | 70.5 | 74.8 | 68.7 |
| $Al_2O_3$ | 15.6 | 18.0 | 19.0 | 15.7 | 12.7 | 19.6 |
| $FeO$ $Fe_2O_3$ | 2.8 | 8.2 | 2.8 | 2.6 | 1.8 | 3.8 |
| $C_2O$ | 2.5 | 1.4 | 5.0 | 2.8 | 1.5 | 5.4 |
| $MgO$ | 0.7 | 0.6 | 1.2 | 0.5 | 0.2 | 1.2 |
| $Na_2O$ | 4.0 | 4.4 | 5.4 | 4.2 | 4.4 | 5.0 |
| $K_2O$ | 2.4 | 2.8 | 1.2 | 2.2 | 3.0 | 1.0 |
| Ig-loss | 2.2 | 2.5 | 0.6 | 2.0 | 2.7 | 0.5 |
| Total | 100.4 | 100.5 | 100.6 | 100.5 | 100.1 | 100.2 |

The grinding of plate glass in the glass industry produces large quantities of waste powder. This super-fine powder has too high of an iron content to allow its reuse in glass-making. Its chemical composition is shown in Table 2.

TABLE 2

| $SiO_2$ | $Al_2O_3$ | $Fe_2O_3$ | $CaO$ | $MgO$ | $Na_2O$ | $K_2O$ | Total |
|---|---|---|---|---|---|---|---|
| 50.9 | 22.0 | 16.1 | 8.2 | 2.1 | 5.1 | 0.7 | 100.1 |

It is preferred to use a mixture of Shirasu and waste powder from glass plate grinding process rather than to use them separately. Shirasu is vitrified at fairly low temperatures with decreased surface area, making silicon-containing vapor hard to produce. On the other hand, if a layer of Shirasu is arranged so that it is supported by the plate-glass grinding waste powder, it is relatively easy to produce the desired silicon-containing vapor for a longer period of time. Moreover, the iron oxide contained in the waste powder as an impurity has an effect of accelerating whisker growth.

Raw materials for carbon are industrially available in large quantities and in pure form. The silcon and carbon materials can be kneaded together with the addition of methyl cellulose as a sticking agent, and molded into thin configurations such as a short hollow pipe, a twisted flake, corrugated plate, or entangled threads. When piled up, these configurations facilitate both the passage of gas and the formation of sufficient spaces to grow whiskers therein. Raw materials which have voids in themselves, like carbonized rice husks, or materials which have a shape of short hollow pipe are particularly preferable.

As the binder material, it is preferable to use high-purity cellulose such as filter paper impregnated with silicone resin, dried and molded, for example, into corrugated form.

No matter what raw material is utilized, it is necessary to charge the material onto the perforated tray in a manner permitting the easy passage of gas.

To aid in the formation of silicon nitride whisker, it is preferable to add $\beta$-$Si_3N_4$ powder as crystal nuclei to the reactant material before charging it onto the tray. The particle diameter of the $\beta$-$Si_3N_4$ powder is preferably 5 or less, and the amount added is empirically 1 to 30% by weight, preferably 10 to 20% by weight, most preferably 12 to 15% by weight based on the weight of Si in the material.

The gas-permeable tray charged with the material is then introduced into a furnace of non-oxidizing atmosphere. The interior of the furnace is divided into a plurality of temperature zones increasing stage-by-stage from about 400° C. to 1,450° C.; for example, 400° C., 500° C., 600° C., 700° C., 1,100° C., 1,200° C., 1,300° C., 1,350° C., and 1,450° C., respectively. Nitrogen gas is continuously circulated through the furnace in the direction from lower to higher temperature. In relatively low-temperature zones from 400° C. to 1,300° C., an inert gas such as argon may be used in lieu of nitrogen to sparge the system of contaminants.

The tray is moved through the temperature zones in the direction from lower to higher temperature at specified time intervals. During this process, the material on the tray is heated, and after the impurity contents have been scattered, the silicon content in the material is nitrided. The time required to purge impurities while the tray is being intermittently moved is between 1 and 24 hours per zone, preferably 5 to 24 hours for each temperature zone of 400° C., 500° C., 600° C., 700° C., 900° C., 1,100° C., 1,200° C. and 1,300° C. The time during which silicon content in the material is nitrided in the temperature zones from 1,350° C. to 1,450° C. is 2 to 10 hours, preferably 4 to 10 hours. Flow rate, flow speed, and temperature of non-oxidizing gas vary, depending upon the internal volume of the furnace and the amount of material charged into the furnace.

The silicon nitride whiskers formed on the internal and external surfaces of the reactant material are recovered in the form of single crystals by the following procedure: When removed from the furnace, the material on the tray has its internal and external surfaces covered with a tangle of intertwined silicon nitride whiskers. The material is put into water and stirred slowly to avoid damage to the whiskers. In that regard, stirring may best be effected by methods such as aeration or ultrasonic wave, rather than by mechanical stirring.

When the material has loosened somewhat, there is added to it a hydrophobic organic liquid such as kerosine, and a quantity of a strong acid, preferably hydrochloric acid. The mixture is then heated to 40°–50° C. while being stirred slowly, and allowed to stand still for a while. When the water and kerosine phases separate from each other, the whiskers will have moved into the bottom water phase and the other components of the material will have moved into the top kerosine phase. The addition of hydrochloric acid increases the hydrophilic properties of the whiskers and provides earlier and more complete settling of the whiskers into the aqueous phase. The whiskers caught in the water phase can be purified in high efficiency by flotation techniques by use of a commercial detergent or metal soap, but a series of simple water washings serves to remove most of the impurities, giving pure silicon nitride whiskers.

Kerosine and hydrochloric acid may be added to water in advance. An auxiliary dispersant may be added to help loosen the material in water, but care should be taken to select a dispersant that does not emulsify the organic liquid. Although the cooked material containing silicon nitride whiskers may be mechanically loosened before the liquid separation step, some damage to the whiskers is unavoidable if such a procedure is attempted.

The material caught in the kerosine phase contains a powder of the same chemical composition as that of the whiskers, as well as some carbon-containing impurities. By burning this residue in the presence of oxygen at temperatures below 1,000° C., any carbon impurities will be removed, leaving only silicon nitride powder. This "waste" powder can be used as an abrasive, as a raw material for the ceramics' industry, or as a material for high-temperature ceramics.

It is also possible to avoid the purification step utilizing the two phase organic solvent/water separation method. If the material removed from the furnace is burned directly without separation and purification, a mixture of silicon nitride whisker and silicon nitride powder is obtained, which can be used as a material of high-mechanical strength for high-temperature ceramics.

An embodiment of the furnace used in the industrial application of the invention is described in the attached drawing. The drawing is a fragmentary plan view (the center portion not shown) showing the cross section of a furnace which has its outer structure and interior partitions made of heat-resistant material. The furnace is provided at both its ends with an inlet gas replacing chamber (1) and outlet gas replacing chamber (2), and divided into upper and lower stages. The lower stage is provided with a number of small chambers (3) having an open top and a gas blowing port (4) attached to the bottom. The small chambers (3) accommodate a quantity of carbon pellets (5). In the upper stage, trays (7) are arranged in each of said small chambers. The bottom of the trays (7) are provided with a large number of holes (6) small enough to prevent reactant material (8) from falling through. The tray may be formed of silica-alumina, but graphite is more favorable since it provides higher thermal impulse resistance when moved into higher or lower temperature zones.

An embodiment of a manufacturing process according to the invention is hereinafter described with reference to the drawing. A tray (7) charged with material (8) such as rice husks is placed over the inlet gas replacement chamber (1) into which a non-oxidizing gas is fed and tray (7) is allowed to come to equilibrium with the non-oxidizing atmosphere. Door (9) is pulled up to an open position, and tray (7) is moved above the small chamber (3) (at the left end of the drawing) which is set to the lowest temperature in the furnace. Each of the small chambers (3) to the right of this first chamber are set to successively higher temperatures. Each small chamber (3) is filled with an adequate quantity of carbon pellets and provided with a resistance heating element (10) to keep a specified temperature (400° C. for example). Since nitrogen gas or the non-oxidizing gas (argon gas, for example) is blown upward through the gas blowing port (4) at a specified flow rate and in a specified quantity, material (8) on tray (7) is gradually heated by the hot gas flowing in from the small holes provided in the bottom of the tray. Gas exits through an outlet (11). Though partly omitted in the drawing, there are provided, in a preferred embodiment, about 20 small chambers in total. The chambers are held, in series, at temperatures from about 400° C. to 1,200° C., in 100° C. increments, each temperature including one or two small chambers. Because the desired whisker crystal growth is initiated at about 1,300° C., in the preferred furnace apparatus, three chambers are held at 1,300° C., and four chambers each are set to 1,350° C. and 1,450° C. As shown in the drawing, a space large enough to accommodate one tray is provided directly above each of these small chambers.

The furnace apparatus provides a means whereby material on a series of trays can be intermittently moved into a preheated small chamber, held for a specified time, and thereafter moved to a chamber at a higher temperature. The temperature range from 400° C. to 1,300° C. constitute preheating to remove contaminants, whereupon the material is nitrided in the temperature range from 1,350° C. to 1,450° C., and then cooled to room temperature.

Since impurities such as Na, Cl, K, Mg, and Al, are gradually scattered and crystallized on the ceiling of the furnace while the tray is moving through the furnace body, the purity of silicon nitride whisker and powder produced on the inner and outer surfaces of the reactant material by the reaction of silicon containing vapor with nitrogen containing vapor at 1,350° C. to 1,450° C. is dramatically increased.

Table 3 shows experimental data which demonstrates that the impurities decrease as the temperature increases in the various temperature zones in the furnace. That is, the purity of silicon nitride increases as the reactant material passes through zones of higher temperatures.

TABLE 3

|    | 700° C. | 800° C. | 900° C. | 1000° C. | 1100° C. | 1200° C. | 1300° C. | 1400° C. |
|----|---------|---------|---------|----------|----------|----------|----------|----------|
| Na | 100     | 100     | 80      | 78       | 48       | 10       | 1        | 0        |
| Mg | 100     | 100     | 100     | 100      | 100      | 97       | 90       | 70       |
| Al | 100     | 100     | 100     | 100      | 100      | 100      | 95       | 88       |
| P  | 100     | 100     | 100     | 95       | 90       | 88       | 75       | 55       |
| S  | 100     | 100     | 95      | 87       | 80       | 64       | 50       | 21       |
| Cl | 100     | 100     | 98      | 90       | 74       | 51       | 14       | 0        |
| K  | 100     | 100     | 100     | 98       | 95       | 80       | 62       | 20       |
| Ca | 100     | 100     | 100     | 100      | 100      | 93       | 85       | 74       |
| Fe | 100     | 100     | 100     | 100      | 99       | 97       | 95       | 80       |

The above experimental data reflect the amount of each element left in the material after it was heated for 2 hours at each temperature, when compared to the same element when analyzed after heating at 700° C. (amount of element at 700° C. = 100 parts). As shown by the data for 1,400° C., the proportion of each impurity in the material has significantly decreased, resulting in a corresponding increase in the purity of the desired silicon nitride.

Table 4 presents the results of fluorescent X-ray analysis of impurity elements scraped from the ceiling of the furnace at the conclusion of the experiment illustrated in Table 3. This material was removed from the reactant material by the action of heat and the passage of the inert gas and recrystallized on the ceiling of the furnace.

TABLE 4

(unit: %)

| | | | Temperature Zone in Furnace | | | | |
|---|---|---|---|---|---|---|---|
|    | Inlet Zone | 700° C. Zone | 1000° C. Zone | 1200° C. Zone | 1400° C. Zone | Cooling Zone | Outlet Zone |
| Na | 9    | 5    | 3    | 2    | 0    | 2   | 2   |
| Mg | 0.5  | 1.5  | 0.5  | 0.6  | 0.05 | 3.0 | 0.7 |
| Al | 0.1  | 0.1  | 0.1  | 0.3  | 2.5  | 0.1 | 0.2 |
| P  | 10   | 2    | 4.5  | 4.0  | 0.08 | 3.2 | 8.0 |
| S  | 7    | 6    | 4.0  | 4.0  | 0.05 | 4.5 | 4.5 |
| Cl | 25   | 6    | 6.2  | 5.0  | (—)  | 4.2 | 4.5 |
| K  | 28   | 7    | 15   | 7.5  | 0.07 | 3.0 | 3.0 |
| Ca | 0.05 | 0.05 | 0.05 | 0.70 | 0.70 | (—) | (—) |
| Fe | 0.20 | 0.80 | 0.35 | 0.40 | 0.80 | 0.38| 0.80|

These experimental data demonstrate that relatively large amounts of impurity elements are scattered and crystallized on the furnace ceiling in the starting stage of preheating (400° to 650° C.), but that the deposits decrease as the temperature is increased to 700° C., 1,000° C., 1,300° C., and 1,400° C. However, in the furnace's cooling zone (room temperature) and in the gas outlet, a slight increase in the quantity of impurity elements is observed.

It is believed that this analysis of impurity elements, which reveals that various impurities, though different depending upon the type and temperature, are recrystallized on the ceiling from the inlet to the outlet of the furnace, further confirms the purity of the silicon nitride whiskers on the external and internal surfaces of the material in the tray at the furnace outlet. It is hypothesized that the larger amount of impurity elements observed in the cooling zone and the gas outlet, when compared to the high temperature zones, (from 1,350° C. to 1,450° C.) is due to the condensation of scattered impurity elements by the rapid temperature drop.

Comparative data to demonstrate the effect of β-$Si_3N_4$ powder, attached as crystal nuclei to the raw material for silicon nitride manufacture, are shown in Table 5.

TABLE 5

| | Yield of $Si_3N_4$ manufactured by the process of the invention (based on Si in material) |
|---|---|
| Added with β-$Si_3N_4$ powder (15% by weight of Si in material) | $Si_3N_4$ whisker 38.52% ($Si_3N_4$ powder 44.31%) |
| Added with α-$Si_3N_4$ powder (15% by weight of Si in material) | $Si_3N_4$ whisker 22.05% ($Si_3N_4$ powder 53.61%) |
| No addition of β-$Si_3N_4$ powder | $Si_3N_4$ whisker 14.25% ($Si_3N_4$ powder 66.39%) |

Note:
Carbonized rice husks (calcinated at 600° C.) were used as the raw material.

As is obvious from the above comparative experimental data, addition of β-$Si_3N_4$ powder to the raw material results in yields of $Si_3N_4$ whisker of 38.52% and yields of $Si_3N_4$ powder of 44.31%, very favorable results when compared with the case of no addition. When the β-$Si_3N_4$ powder was replaced with α-$Si_3N_4$ powder, the production of $Si_3N_4$ whisker was inhibited, resulting in a lower yields.

Acid pre-treatment before the heating step will aid in the removal of impurities and organic compounds from the material, and will permit more effective treatment after the reaction has been completed. An example of acid pre-treatment of rice husks is now described.

Raw rice husks are boiled in 5N-HCl solution for 0.5-1 hour. This reduces cellulose, the main component of the rice husks; that is, the carbohydrate is deoxidized and converted into low-molecular blackened compounds. The proteins in the rice husks are decomposed into amino acids. These decomposition products are eluded upon heating, leaving porous rice husks. This treatment facilitates the scattering of impurities from the rice husks, reaction of silicon with nitrogen, and growth of silicon nitride whiskers.

The results of fluorescent X-ray analysis of the elemental content of rice husks after being boiled in 5N-HCl and washed is set forth in Table 6. The results are expressed in parts, where 100 parts represents the elemental content of the raw (untreated) rice husks. The efficacy of the use of the acid as a pre-treatment is demonstrated by the data in the last column which shows a post-treatment of the material with acid. There, raw rice husks were calcinated by heating in accordance with the procedures previously outlined, and then boiled in 5N-HCl. Pre-treatment is far more effective.

TABLE 6

Element content of rice husks after acid treatment

| Type of element contained in rice husks | Element Content in rice husks after acid treatment | Element content in rice husks acid-treated after calcination (reference) |
|---|---|---|
| 1 Na | 100 | 0 | 0 |
| 2 Mg | 100 | 0 | 69 |
| 3 Al | 100 | 71 | 31 |
| 4 Si | 100 | 100 | 100 |
| 5 P | 100 | 2 | 43 |
| 6 S | 100 | 11 | 120 |
| 7 Cl | 100 | 0 | 85 |
| 8 K | 100 | 2 | 30 |
| 9 Ca | 100 | 6 | 41 |
| 10 Fe | 100 | 19 | 55 |
| 11 Mn | 100 | 4 | 72 |
| 12 Ni | 100 | 71 | 115 |
| 13 Cu | 100 | 71 | 130 |
| 14 Zn | 100 | 18 | 85 |

If industrial quantities of product are desired, a vertical furnace may be more desirable than the furnace depicted in the accompanying drawing. Operation of the illustrated furnace, while satisfactory from a technical point of view, is labor intensive. In the vertical furnace, raw material is intermittently fed into the top of the furnace by a screw feeder, and dropped from the preheating zone into the nitriding zone at specified time intervals until finally removed from the bottom of the furnace when the reaction is completed. In this case, use of a porous tray is not required.

From the material laden with silicon nitride whiskers and powder, formed as a result of the specified treatment in the furnace, only the silicon nitride whiskers will pass into the aqueous phase when treated with a mixture of hydrophobic organic liquid, water, and hydrochloric acid.

Unlike conventional methods, in the method of the present invention, silicon nitride is formed on the internal and external surfaces of the reactant material, rather than on a surface separated from the material. Thereafter, silicon nitride whiskers can be obtained in a very high yield, by treating the material after nitriding with a mixture of a hydrophobic organic liquid (such as kerosine), water, and hydrochloric acid. In addition, nearly all silicon content in the material can be converted into silicon nitride.

It is also possible to use the whiskers produced without passing through a separating process. When the liquid separation step is omitted, the product will be less pure —in the form of a mixture of silicon nitride powder, silicon nitride whisker, and carbon; or a mixture of silicon nitride powder and silicon nitride whisker, with the carbon burned out.

The process according to the invention is very economical in cost, since the raw materials to be used are available in large quantities at very low prices, being carbonized rice husks, silica sand, raw material of silica anhydride, shirasu, and waste powder from plate glass grinding.

The following examples illustrate specific embodiments of the claimed invention:

EXAMPLE 1

Rice husks, having chemical analyses of ignition loss: 79.61%, $SiO_2$: 17.55%, $Al_2O_3$: 0.04%, CaO: 0.04%, MgO: 0.16%, were boiled in 5N HCl for 1 hour, washed with hot water and dried. (Chemical analyses of the impurities after this treatment were $Al_2O_3$: 0.03%, $Fe_2O_3$: 0.002%, CaO: 0.007%, and MgO: 0.008%). One hundred grams of the acid-treated dried rice husks was sprayed with 1.25 g of $Si_3N_4$ powder ($\alpha$-$Si_3N_4$ 30%, $\beta$-$Si_3N_4$ 70%) dispersed in a quantity of alcohol (water or an alcohol/water mixture could also be used), put into a graphite vessel having a perforated bottom, and placed on a layer of graphite pellets filled in an almina muffle furnace to a thickness of 5 cm.

The rice husks in the graphite vessel were heated and held at 800° C. for 3 hours, at 1,000° C. for 3 hours, and at 1,200° C. for 3 hours, while nitrogen gas was kept flowing from the bottom to the top through the vessel at a rate of 0.5l/min. Thereafter, the temperature was raised at a rate of 3° C./min. to 1,400° C. with nitrogen gas kept flowing at a rate of 5l/min. After this, the temperature was lowered to 1,000° C. with nitrogen flow rate decreased to 0.5l/min., and the system closed and allowed to cool down with nitrogen gas flow stopped.

White whisker-like material deposited on the ceiling of the vessel, was analyzed by means of X-ray diffraction and found to be a mixture of $\alpha$-$Si_3N_4$ and an amorphous material which showed high fluorescent X-ray analyses of $Al_2O_3$: 2.78%, $Fe_2O_3$: 0.88%, CaO: 0.79%, and MgO: 0.24%. This material removed by the gas during heating, reflects the high "impurity" of the original material.

The remaining rice husks, blackened by carbonizing but having the original rice husk configuration, contained white whisker-like material which was taken out of the vessel and stirred in 3:7 mixture of kerosine and water for 1 hour and left at rest.

Carbides, separated into the oil phase, were burnt at 800° C. for 2 hours in oxidizing atmosphere to give 6.04 g of grayish white powder. The material separated into the water phase was washed with hot water and dried to give 5.25 g of whisker. According to X-ray diffraction, both the powder and whisker consisted mainly of $\alpha$-$Si_3N_4$. The impurity contents of the powder were very low —$Al_2O_3$: 0.22%, $Fe_2O_3$: 0.001%, CaO: 0.004%, and MgO: 0.005%. The purity of the whisker was also very high, with negligible impurity contents, viz, $Al_2O_3$: 0.012%, $Fe_2O_3$: ND, CaO: 0.001%, and MgO; ND.

It was shown by electron microscopic observation that the individual whiskers were 0.5 to 1.0μ in diameter and 50 to 300μ in length, and by limited field electron diffraction that each whisker was a single crystal of $Si_3N_4$. It was found that $Si_3N_4$ powder and whisker were obtained in yields of 95% or more, based on the quantity of Si in the raw material, while nearly 5% was removed as impurity.

EXAMPLE 2

The rice husks of Example 1 were calcinated at 600° C., and 100 g thereof was sprayed with 1.5 g of $Si_3N_4$ powder ($\alpha$-$Si_3N_4$ 30%, $\beta$-$Si_3N_4$ powder 70%), dispersed in alcohol, and nitrided by the same method as in Example 1. Deposits on the ceiling were removed and the remaining calcinated material in the vessel was put into 3:7 mixture of kerosine and water. After 1 hour of stirring, the material was left at rest in the same manner as in Example 1.

The carbides separated into the oil phase were calcinated at 800° C. for 2 hours in an oxidizing atmosphere, while those in the water phase were washed with hot water and dried to gave 11.72 g of a whisker-like product. As was the case in Example 1, the isolated powder and whisker consisted mainly of α-Si₃N₄ with low amounts of impurities, viz, Al₂O₃: 0.03%, Fe₂O₃: 0.01%, CaO: 0.01%. Si₃N₄ powder and whisker were obtained in a yield of 95% or more based on the quantity of Si in the raw material, as was the case in Example 1.

EXAMPLE 3

Filter paper was impregnated with a silicone resin, dissolved in toluene (Si content: 41%, 10 g of silicon resin in 60 ml of toluene) and dried. The dried filter paper was cut into ribbons about 5 mm wide, rounded by hand into corrugate form, sprinkled with the Si₃N₄ powder of Example 1 in an amount equal to 2.0% by weight based on the amount of Si impregnant, and charged into a graphite vessel having a perforated bottom.

Powder and whisker, mainly composed of α-Si₃N₄, were obtained by nitriding the treated filter paper and isolating with mixed kerosine and water solution by the method of Example 1. Fluorescent X-ray analysis showed that the purity of the products were higher than that in Examples 1 and 2 —Mg, Ca, Al, and Fe impurities all being less than 0.001% in the powder as well as in the whisker.

EXAMPLE 4

Ten parts by weight of volcanic ash or Shirasu (from Taniyama) and 10 parts by weight of lamp black were kneaded together with a methylcellulose binder, extruded into a round tube, 8 mm in diameter and 0.5 mm in thickness, cut into lengths of 15 mm, and dried. Two grams of Si₃N₄ powder was sprinkled on the surface of one hundred grams of this dried tubular material and the treated material charged into a graphite vessel having a perforated bottom in the same manner as in Example 1.

The material was nitrided under the same conditions and by the same procedures as Example 1, yielding 9.2 g of powder and 14.9 g of whisker. X-ray diffraction analysis showed that both the powder and the whisker consisted mainly of α-Si₃N₄, while fluorescent X-ray analysis showed that the powder contained 1.41% Al₂O₃, 0.52% CaO, 0.21% MgO, and 0.17% Fe₂O₃, and the whisker contained 0.56% Al₂O₃, 0.43% CaO, and 0.06% MgO. The yield of Si₃N₄ powder and whisker was about 90% based on the amount of Si in the raw material, while about 10% was removed as impurities.

EXAMPLE 5

Twenty-five parts by weight of waste powder from glass grinding, 25 parts by weight of silica powder, and 50 parts by weight of lamp black were kneaded together with a methylcellulose binder, extruded in the same manner as in Example 4, cut into lengths of 15 mm, and dried. One hundred grams of the dried material, was sprinkled with 2 g of Si₃N₄ powder, lightly charged into a graphite vessel having a perforated bottom, and nitrided under the same conditions as in Example 1, yielding 11.2 g of powder and 13.5 g of whiskers. Both powder and whisker were -Si₃N₄ and had nearly equal purity to the product of Example 4.

EXAMPLE 6

Absorbent cotton impregnated with dried silicone oil was nitrided under the same conditions and by the same method as in Example 1 and the product was recovered in the same manner. Analysis by X-ray diffraction revealed the product to be α-Si₃N₄ which contained a negligible amount of impurities according to fluorescent X-ray analysis. Electron microscopic observation revealed the configuration of the product to be somewhat different than the crystalline material of Examples 1 to 5, having a thinner diameter and a longer length, viz, diameter, 0.1μ; length, 1 to 2 mm, and aspect ratio, 10,000 to 20,000.

As illustrated in U.S. application Ser. No. 06/746,199, filed on the same date herewith in the name of M. Tanaka, T. Kawabe and M. Kobune, silicon carbide whisker crystals can be formed from a carbon and silicon containing material by heating under similar conditions, while circulating a nitrogen-free, non-oxidizing gas. The addition of a small amount of a boron compound (i.e., $H_3BO_3$) or a lanthanum compound (i.e., $LaCl_3$) to the silicon and carbon containing material prior to heating accelerates SiC crystal growth in the same manner as β-Si₃N₄ in the present invention. The SiC whisker crystal will pass into the aqueous phase of a two-phase mixture of organic solvent and water and can be isolated therefrom.

What is claimed:

1. A method of manufacturing silicon nitride comprising the following steps:
    (a) providing a silicon and carbon containing material having both a thin cross section and sufficient porosity to permit the passage of a gas therethrough;
    (b) arranging said material on a gas-permeable, heat-resistant support;
    (c) placing the material-bearing support in an air tight furnace, said furnace adapted to provide a plurality of temperature zones from a low of about 400 degrees C. through a high in the range 1,350 degrees C. through 1,450 degrees C.;
    (d) horizontally moving said material-bearing support successively through each of said temperature zones, in the direction of increasing temperature;
    (e) passing a non-oxidizing gas through the heated material, said gas being nitrogen in zones of the furnace wherein the temperature is in excess of about 1,300 degrees C.; and
    (f) removing silicon-nitride whisker-containing material from said furnace.

2. The method of claim 1, further including the step: treating said silicon and carbon containing material with β-Si₃N₄ prior to heating in said furnace.

3. The method of claim 1, further including the steps: dispersing said silicon nitride whisker-containing material in a vessel containing a mixture of a hydrophobic organic liquid and water;
    maintaining the dispersion containing said whisker-containing material in an unagitated condition whereby the aqueous phase and the organic phase become separated; and
    separating silicon nitride crystals from said aqueous phase.

4. The method of claim 3 wherein said vessel contains substantially equal volumes of water and organic liquid.

5. The method of claim 3, further including the step: isolating silicon nitride powder from said organic phase.

6. The method of claim 3, wherein said vessel containing a mixture of organic liquid and water further contains a mineral acid.

7. The method of claim 1, wherein said silicon and carbon containing material comprises rice husks.

8. The method of claim 1, wherein said silicon and carbon containing material comprises a gas-permeable material selected from the group consisting of:
   (a) cellulose impregnated with silicone resin;
   (b) a mixture of volcanic sand, carbon black, and a binder; or
   (c) a mixture of silica powder, waste powder from glass grinding, silica, and a binder.

9. A method of separating a collection of silicon nitride comprising dispersing materials having generated and grown silicon nitride on the internal and external surfaces thereof into a mixture of a hydrophobic organic liquid, water, and hydrochloric acid, and after keeping it at rest, separately isolating said whiskers in the water phase and the rest of the material in the organic liquid phase.

10. A method of manufacturing silicon nitride comprising the following steps:
   (a) pretreating a quantity of rice husks by heating said husks in concentrated hydrochloric acid;
   (b) removing said acid from the treated husks;
   (c) arranging said treated husks on a gas-permeable, heat resistant support in a manner permitting the flow of a gas through said treated husks;
   (d) placing the treated-husk-bearing support in an air tight furnace, said furnace adapted to provide a plurality of temperature zones from a low of about 400 degrees C. through a high in the range 1,350 degrees C. through 1,450 degrees C.;
   (e) moving said treated-husk-bearing support successively through each of said temperature zones, in the direction of increasing temperature;
   (f) passing a non-oxidizing gas through the heated husks, said gas being nitrogen in zones of the furnace wherein the temperature is in excess of about 1,300 degrees C.; and
   (g) removing silicon-nitride whisker-containing material from said furnace.

* * * * *